DEVICE FOR FORMING FLUID PULSES

Filed Sept. 16, 1963

INVENTOR

WALTER G. WADEY

BY Griffin and Stokes

ATTORNEYS

United States Patent Office 3,266,510

Patented August 16, 1966

3,266,510

DEVICE FOR FORMING FLUID PULSES

Walter G. Wadey, Bethesda, Md., assignor to Sperry Rand Corporation, New York, N.Y., a corporation of Delaware Filed Sept. 16, 1963, Ser. No. 309,141
2 Claims. (Cl. 137—81.5)

This invention relates to a fluid device for limiting the duration of a pulse in fluid circuits.

For many fluid devices an output therefrom is essentially continuous until a positive step is taken to terminate said output at its source. This is particularly true in the so-called pure fluid amplifier wherein a fluid power jet stream is deflected to a particular output channel by means of an input control stream. The power stream normally remains flowing in the selected output channel either until the control input disappears, or until an input control stream of opposite direction is applied to the amplifier. In pure fluid logic systems, it is very often desirable and even necessary to utilize the power stream output of a pure fluid amplifier as a control stream input for subsequent circuits. Usually a control input stream must be in the form of a pulse of predetermined time duration in order to avoid timing problems inherent in logic systems. Therefore, to permit effective use of the power stream output of a pure fluid amplifier as a control stream source, it may be necessary to limit its effective duration when applied to a following circuit. The present invention performs this time limit function by receiving an input fluid stream of indefinite duration and separating it into two portions both of which are applied at different times to a pure fluid amplifier whose output in turn becomes a fluid pulse of predetermined duration. In one embodiment, the two portions of the separated input stream are respectively applied to opposing control input channels of said fluid amplifier, whereas another embodiment of the invention utilizes the separated input stream portions as the power stream and control stream inputs to said pure fluid amplifier.

Therefore, it is one object of the present invention to provide a pure fluid pulse forming device which includes a pure fluid amplifier for receiving a fluid signal of indefinite duration in order to form an output fluid signal of predetermined duration.

A further object of the invention is to provide a fluid pulse former whereby an input fluid stream of indefinite duration is separated into two portions which in turn are selectively applied at different times to two input channels of a pure fluid amplifier.

Yet another object of the present invention is to provide a pure fluid pulse forming device which includes a pure fluid amplifier having opposed control input channels each selectively receiving at different times a different portion of a dividend input stream.

A further object of the invention is to provide a pure fluid pulse forming device having a pure fluid amplifier whose power stream and a control stream are derived from separated portions of an input fluid stream.

Figure 1:
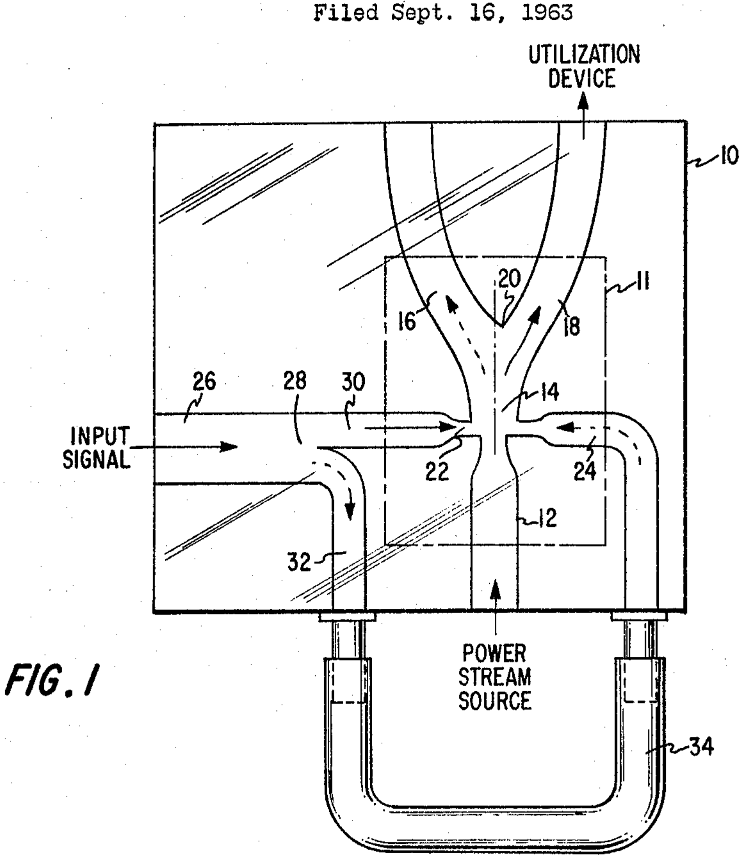
Figure 2:
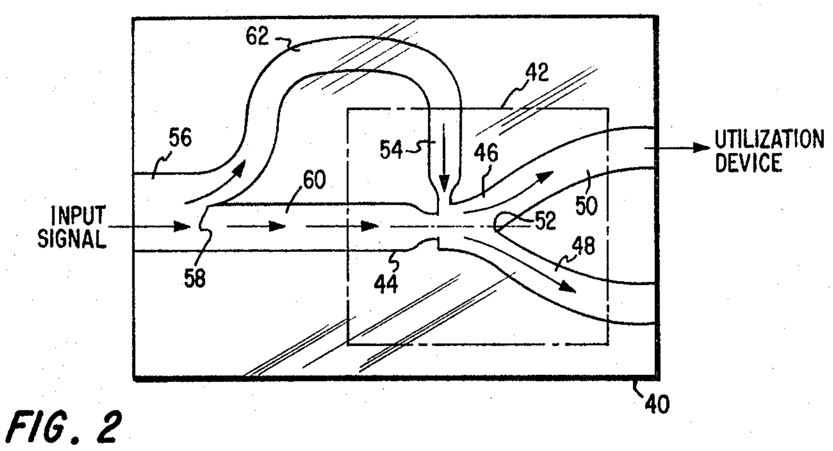

These and other objects of the invention will become apparent during the course of the following description to be read in view of the drawings, in which:

FIGURE 1 shows one embodiment of the invention whereby the input signal forms two control inputs of a pure fluid amplifier; and FIGURE 2 shows another embodiment of the invention whereby the input signal forms one control input and the power input of a pure fluid amplifier.

FIGURE 1 illustrates one embodiment of the invention utilizing a pure fluid amplifier having at least two opposed control input channels. A plurality of interconnected fluid conducting channels are formed or otherwise cut in a body of fluid impervious material 10, such as transparent plastic. The pure fluid amplifier configuration is that illustrated within the dot-dash rectangle 11 and is comprised of a power stream input channel 12 which terminates at one end of a fluid interaction chamber 14. Branching from interaction chamber 14 are two power stream output channels 16 and 18 which come together at a divider edge 20. Two opposed control stream input channels 22 and 24 also enter chamber 14 substantially perpendicular to the flow axis of power stream 12. When a power stream source (not shown) introduces fluid to channel 12, said fluid exits as a jet into chamber 14. The flow divider 20 is disposed asymmetrically with respect to the center line of channel 12, being to the right thereof. This disposition of divider 20 causes the power jet to exit from chamber 14 via output channel 16 so that output channel 18 conveys little or no fluid to a utilization device connected to its output. However, by introducing a control stream from channel 22 into chamber 14, the power stream may be deflected into output channel 18 whereupon it flows to said utilization device. When there are control streams issuing simultaneously from both control channels 22 and 24 into chamber 14, each cancels the effect of the other so that the power stream can flow only through output channel 16. A pure fluid amplifier having these characteristics is well known to the prior art so that further details thereof need not be given here.

An input fluid stream of variable duration, from which is to be generated an output fluid stream of predetermined duration, is initially applied to an input channel 26 from some source not shown. A Y junction 28 is provided at the other end of channel 26 which separates this input stream into first and second control streams. The first control stream travels via a channel 30 to control input channel 22 of fluid amplifier 11, while the second control stream travels via a channel 32 to the opposite control channel 24 of amplifier 11. However, these channels 30 and 32 are constructed to give unequal time delays to fluid passing therethrough, said different time delays in the preferred embodiments being obtained by unequal channel lengths. Channel 32, by virtue of its longer length, requires more time in traversal by its control stream than does channel 30. By breaking channel 32 into two portions and connecting same with a sliding trombone conduit 34, the effective length of channel 32 can be varied so as to vary its time delay.

The operation of the FIGURE 1 device is as follows. In the absence of any input fluid in channels 26, 30 and 32, the power stream of amplifier 11 flows through chamber 14 and exits therefrom via output channel 16. For this condition the utilization device connected to the output of channel 18 receives no fluid energy. When an input fluid stream of undetermined duration is initially applied to channel 26, its leading front travels to the divider Y junction 28 where it separate into two portions which travel through channels 30 and 32 to opposite control inputs of the fluid amplifier. The fluid in channel 30 forms a control stream whose leading front issues from control input 22 into chamber 14 at a time prior to the issuance of the leading front of control stream fluid from input 24. Thus, the power stream switches from output channel 16 into output channel 18 where it remains until a control stream issues from channel 24, at which time the power stream switches back into output channel 16. A fluid pulse is therefore produced at output 18 whose duration is dependent only upon the difference in time delays of control channels 30–22 and 32–24. In order to obtain a subsequent output pulse from channel 18, the input fluid stream to channel 26 must be terminated to allow channel 32 to exhaust its fluid. The input signal may then be reapplied which results in another output signal from channel 18 of predetermined time duration.

An alternative embodiment is shown in FIGURE 2 wherein the input fluid stream forms the power stream of a fluid amplifier as well as one control stream thereof. As in FIGURE 1, the interconnected fluid channels in FIGURE 2 are generally formed in a body 40 of fluid impervious material such as transparent plastic. The fluid amplifier channel configuration is found within the dot-dash rectangle 42. This amplifier is comprised of an power stream input channel 44 which terminates at a interaction chamber 46 from which branch two output channels 48 and 50. Channel 50 is adapted for connection to a utilization device. A divider edge 52 is asymmetrical to the center line of channel 44, being to the right thereof, such that power stream fluid normally exits from the chamber via channel 50 in the absence of any control stream input. However, in contrast to FIGURE 1, only one control channel input 54 need be provided to the fluid amplifier of FIGURE 2. This channel 54 enters chamber 46 such that a control stream issuing therefrom deflects the power stream from output channel 50 into output channel 48. The power stream remains in channel 48 as long as a control stream issues into chamber 46. During this time no fluid is transmitted to the utilization device connected at the output of channel 50.

Both power stream fluid and control stream fluid are supplied to fluid amplifier 42 as different portions of the input fluid stream. This input stream of indefinite duration is first applied to a channel 56 from some source not shown. A Y divider junction 58 is provided at the other end of channel 56 for separating the input stream into a power stream and a control stream for fluid amplifier 42. The power stream portion flows via a channel 60 to the power stream input channel 44, while the control stream portion flows via a channel 62 to the control input channel 54 of the amplifier. The time required for the power stream to flow through channels 60–44 is shorter than the time required for the control stream to flow through channels 62–54. Therefore, the power stream issues into chamber 46 for some period of time before the control stream finally arrives at said chamber. The two diverse paths 60–44 and 62–54 may be of unequal delay in the preferred embodiment by making them of unequal physical length. A sliding section, similar to 34 in FIGURE 1, can be provided in either or both of these paths to vary said delay.

FIGURE 2 operation is as follows. In the absence of any input to channel 56, there is no fluid flow in either output channel 50 or 48 of the fluid amplifier. By now applying a fluid stream to channel 56, a power stream from channel 44 initially flows through output channel 50 to the utilization device due to the asymmetry of divider 52. This power stream flow through channel 50 only continues until the control stream portion of the input signal arrives at chamber 46 from channel 54, whereupon the power stream is then shifted to now flow through output channel 48. Consequently, the net effect produced in output channel 50 is a fluid pulse whose duration is determined only by the difference in the time delays of channels 60–44 and 62–54.

From the above descriptions of FIGURES 1 and 2, logic equations may be derived which are identical for each. In FIGURE 1 let the presence or absence of a fluid stream at input 22 be denoted by A or $\overline{A}$, respectively; the presence or absence of a fluid stream at input 24 be denoted by B or $\overline{B}$, respectively; and the presence or absence of a fluid stream in output 18 be denoted by C or $\overline{C}$, respectively. In similar manner, for FIGURE 2 let the presence or absence of a fluid stream at input 44 be denoted by A or $\overline{A}$, respectively; the presence or absence of a fluid stream at input 54 be denoted by B or $\overline{B}$, respectively; and the presence or absence of a fluid stream in output 50 be denoted by C or $\overline{C}$, respectively. The following two equations are thus seen to be true for each figure, where the (·) represents the logical "AND" function.

$$A \cdot \overline{B} = C$$

$$A \cdot B = \overline{C}$$

While preferred embodiments have been shown and described, it is obvious that many modifications may be made thereto without departure from the novel principles of the invention. For example, the pure fluid amplifier of FIGURE 2 may be identical to the multiple control input amplifier of FIGURE 1, except that only one control input channel need be utilized. Therefore, the present invention is not to be limited except as defined in the appended claims.

The embodiments of the invention in which an exclusive property or privilege is claimed are defined as follows:

1. A fluid pulse former which comprises:

(a) a monostable fluid amplifier including a power stream input channel having a power stream issuing therefrom, first and second power stream output channels and first and second opposed control stream input channels, means for causing the power stream flow from said power stream input channel to exit from said amplifier via said first power stream output channel when there is no flow from either of said control stream input channels and when there is concurrent flow from both of said control stream input channels but wherein said means is ineffective when there is control stream flow solely from said first control stream input channel and wherein said power stream consequently exits via said second power stream output channel when control stream flow is solely from said first control stream input channel;

(b) a fluid stream divider junction having an inlet and first and second outlets, for receiving a fluid stream at said inlet and simultaneously separating same into said first and second control streams each respectively exiting via said first and second outlets; and (c) first and second fluid channels respectively connected from said divider first outlet to said amplifier first control stream input channel, and from said divider second outlet to said amplifier second control stream input channel, for continuously conveying said first and second control streams to said amplifier, where said first and second fluid channels have unequal time delay characteristics such that the initial application of said second control stream to said amplifier second control stream input channel is delayed with respect to the initial application of said first control stream to said amplifier first control stream input channel, whereby a fluid pulse of predetermined duration appears in said amplifier second power stream output channel.

2. The invention according to claim 1 wherein said second fluid channel is longer than said first fluid channel.

References Cited by the Examiner

UNITED STATES PATENTS

| | | | |
|---|---|---|---|
| 3,016,066 | 1/1962 | Warren | 137—81.5 |
| 3,117,593 | 1/1964 | Sowers | 137—81.5 X |

(Other references on following page)

UNITED STATES PATENTS

| | | | |
|---|---|---|---|
| 3,124,160 | 3/1964 | Zilberfarb | 137—81.5 |
| 3,143,856 | 8/1964 | Hausmann. | |
| 3,159,168 | 12/1964 | Reader | 137—81.5 |
| 3,177,888 | 4/1965 | Moore | 137—81.5 |

OTHER REFERENCES

"The Amateur Scientist," C. L. Stong, Scientific American, vol. 207, No. 2, August 1962, p. 134, bottom figure.

"Generating Timed Pneumatic Pulses," R. E. Norwood, I.B.M. Technical Disclosure Bulletin, vol. 5, No. 9, February 1963, p. 13.

M. CARY NELSON, *Primary Examiner.*

S. SCOTT, *Assistant Examiner.*